(12) United States Patent
Hess et al.

(10) Patent No.: US 8,854,241 B1
(45) Date of Patent: Oct. 7, 2014

(54) TIME MULTIPLEXER CHANNEL CORRECTIONS

(71) Applicants: Gary Hess, Enfield, CT (US); Kirk Lillestolen, East Hartford, CT (US)

(72) Inventors: Gary Hess, Enfield, CT (US); Kirk Lillestolen, East Hartford, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 13/898,216

(22) Filed: May 20, 2013

(51) Int. Cl.
*H03M 1/06* (2006.01)

(52) U.S. Cl.
CPC .................................... *H03M 1/06* (2013.01)
USPC ............ 341/118; 341/122; 341/141; 341/155; 327/172; 327/175; 714/718; 714/719; 714/754; 714/758; 714/777; 710/244; 370/220; 370/228; 370/389; 455/421; 455/436; 455/437; 455/438

(58) Field of Classification Search
CPC .......... H03M 1/14; H03M 1/60; H04B 10/00; H04B 10/296; H04B 10/506; H04B 10/2941; H04B 10/0221; H04L 1/22; G06F 12/14; G06F 12/16; G06F 1/06; G06F 1/12; G06F 11/10; G06F 11/1044; H03K 5/1565
USPC .......... 341/118, 122, 141, 155; 327/172, 175; 714/718, 719, 754, 758, 777, 784, 785; 710/244; 370/220, 228, 389; 455/421, 455/436, 437, 438, 439, 440
See application file for complete search history.

(56) References Cited

U.S. PATENT DOCUMENTS

| 6,219,817 | B1 * | 4/2001 | Holman .................... 714/785 |
| 6,304,204 | B1 * | 10/2001 | Norman .................... 341/161 |
| 6,351,231 | B1 * | 2/2002 | Price et al. ................ 341/155 |
| 7,237,172 | B2 * | 6/2007 | Regev et al. .............. 714/754 |
| 7,526,709 | B2 * | 4/2009 | Regev et al. .............. 714/754 |
| 7,742,761 | B2 * | 6/2010 | Taniguchi et al. .......... 455/421 |
| 7,746,785 | B2 * | 6/2010 | Michels .................... 370/235 |
| 7,839,194 | B2 * | 11/2010 | Chang et al. .............. 327/175 |
| 2003/0197632 | A1 * | 10/2003 | Rubin et al. .............. 341/141 |

* cited by examiner

*Primary Examiner* — Lam T Mai

(74) *Attorney, Agent, or Firm* — Edwards Wildman Palmer LLP; Scott D. Wofsy; Joshua L. Jones

(57) ABSTRACT

A method and system for monitoring an output of an electronic processing component which detects an out-of-range value in the output of the electronic processing component during one time period during which one channel of input channels of a time multiplexer provides an input signal to the electronic processing component. Corrective actions are performed based on the detected out-of-range value. The corrective actions including excluding further multiplexing of signals from the one channel of the input channels.

16 Claims, 5 Drawing Sheets

| State Machine State | Mux Control | Converted Input Value | Notes |
|---|---|---|---|
| 1 | a | Va | Normal conditions |
| 2 | b | Vb | |
| 3 | c | Vc | |
| 4 | d | Vd | |
| 1 | a | Va | |
| 2 | b | Open | Open value is measured on channel B |
| 3 | c | Vc+ | Value on channel C has slight error for one conversion |
| 4 | d | Vd | |
| 1 | a | Va | |
| 2 | c | Vc | New mux control to Vc value not used by software (discarded) |
| 3 | c | Vc | Corrected Value of Vc |
| 4 | d | Vd | |

FIG. 4 a time multiplexer, an A/D converter and a state machine (Prior Art);

TIME MULTIPLEXER CHANNEL CORRECTIONS

FIELD OF THE INVENTION

The embodiments described herein relates to a method and apparatus for correcting time multiplexing channel, and more specifically, to providing an open multiplexer channel charge injection elimination circuit.

BACKGROUND OF THE INVENTION

This section is intended to provide a background or context to the embodiments disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section.

Many programs utilize analog multiplexers for common signal processing prior to A/D (analog-to-digital) converters. The A/D converters and time (or time division) multiplexers are often controlled by state machines that require little to no software intervention. A state machine can cycle through inputs and after allowing sufficient settling time will start the A/D conversion process. After the A/D conversion is complete the state machine will select the next multiplexer channel to its conversion and go through all signals.

FIG. 1 shows an example of a conventional control system 10 comprising a time multiplexer (time division multiplexer) 14, an A/D converter 12 and a state machine 16. The multiplexer 14 comprises 4 channels with corresponding 4 input signals 20a, 20b, 20c and 20d. Each channel has a resistor 22 (R) and a switch (24a, 24b, 24c or 24d respectively). The parasitic output capacitance 26 ($C_{Charge}$) is charged by the input signal 20a, 20b, 20c or 20d when the corresponding switch 24a, 24b, 24c or 24d is open, and then provided to the A/D converter 12 for further processing (analog-to-digital conversion). The timing of opening and closing of switches 24a, 24b, 24c and 24d is controlled by a state machine 16 in a cycle manner and typically each channel may be open for a time period from approximately 10 microseconds to 10 millisecond.

SUMMARY OF THE INVENTION

In one aspect, disclosed is a method and system for monitoring an output of an electronic processing component which detects an out-of-range value in the output of the electronic processing component during one time period during which one channel of input channels of a time multiplexer provides an input signal to the electronic processing component. Corrective actions are performed based on the detected out-of-range value. The corrective actions consisting of excluding further multiplexing of signals from the one channel of the input channels.

BRIEF DESCRIPTION OF THE DRAWINGS

The accompanying drawings illustrate various non-limiting, illustrative, inventive aspects in accordance with the present disclosure:

FIG. 4 depicts an exemplary embodiment of a state machine states illustrating corrective actions for an open circuit in one of the input channels of the time multiplexer.

DETAILED DESCRIPTION OF CERTAIN EMBODIMENTS

Figure 1:
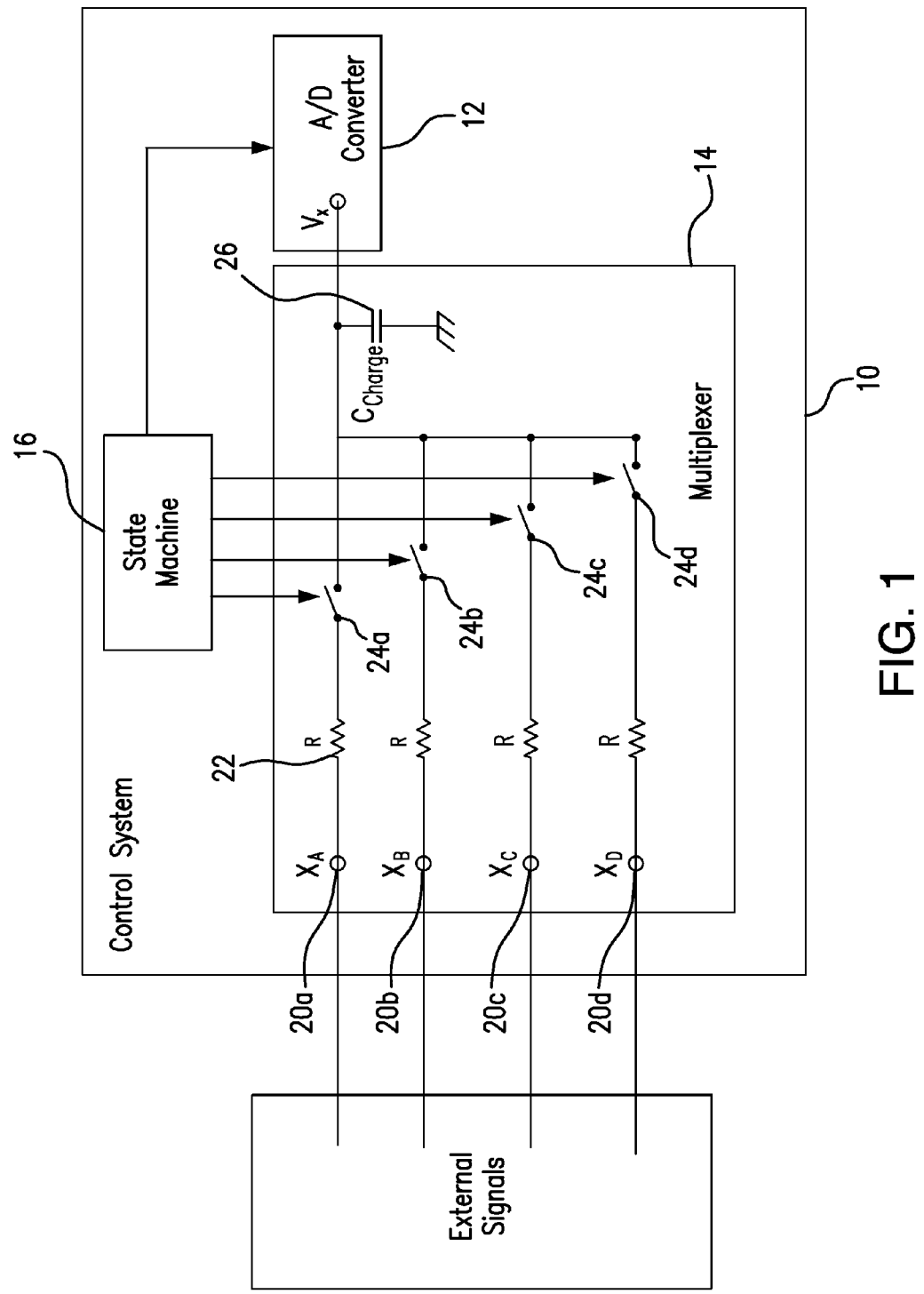
FIG. 1 depicts an example of a control system comprising a time multiplexer, an A/D converter and a state machine (Prior Art)

The present invention is now described more fully with reference to the accompanying drawings, in which illustrated embodiments of the present invention are shown. The present invention is not limited in any way to the illustrated embodiments as the illustrated embodiments described below are merely exemplary of the invention, which can be embodied in various forms, as appreciated by one skilled in the art. Therefore, it is to be understood that any structural and functional details disclosed herein are not to be interpreted as limiting, but merely as a basis for the claims and as a representative for teaching one skilled in the art to variously employ the present invention. Furthermore, the terms and phrases used herein are not intended to be limiting but rather to provide an understandable description of the invention.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, exemplary methods and materials are now described. Any publications mentioned herein are incorporated herein by reference to disclose and describe the methods and/or materials in connection with which the publications are cited.

It must be noted that as used herein and in the appended claims, the singular forms "a", "an," and "the" include plural referents unless the context clearly dictates otherwise. Thus, for example, reference to "a stimulus" includes a plurality of such stimuli and reference to "the signal" includes reference to one or more signals and equivalents thereof known to those skilled in the art, and so forth.

In regard to the drawings (FIGS. 1-5) presented herein, similar reference characters/numbers denote similar elements throughout the drawings.

It is to be understood and appreciated that often normal input operating voltages into the time multiplexers (such as the one shown in FIG. 1) are far smaller than the values seen for open inputs. Large voltages can exist on inputs under open circuit conditions resulting in charging up parasitic capacitances in multiplexers.

Figure 2:
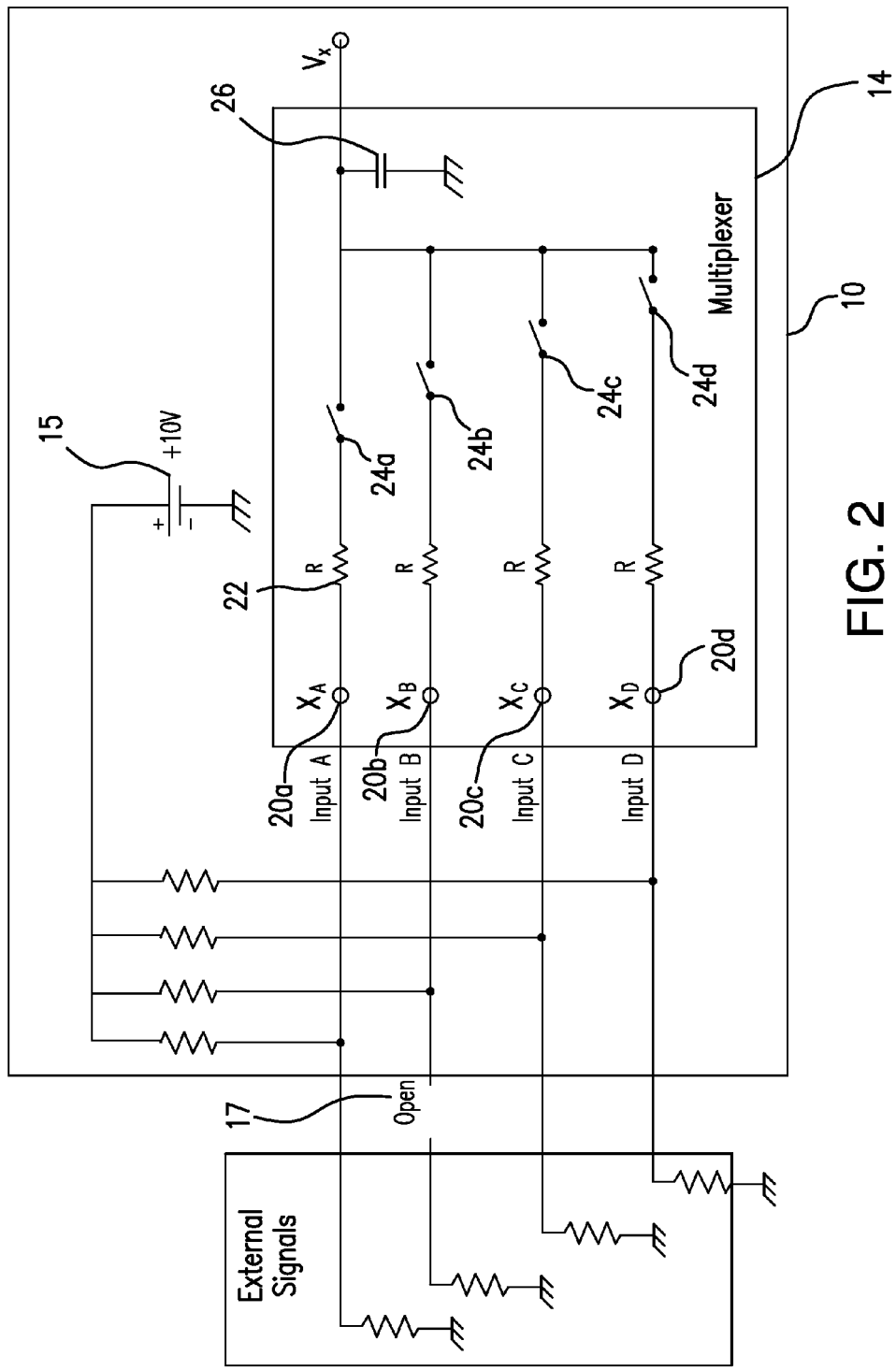
FIG. 2 depicts an example of a control system showing an open circuit in one of the input channel of the time multiplexer to be corrected for using exemplary embodiments described herein.

This is demonstrated in FIG. 2 were an open line (open channel) 17 corresponding to the input signal 20b (input/channel B) would charge the capacitor 26 ($C_{Charge}$) up to 10V of a DC biasing power source 15 when the switch 24b is open. Then an output value generated by an A/D converter 12 for the channel B would be large (out-of scale) in the output of the A/D converter. Moreover, when the multiplexer 14 is switched to a next channel corresponding to the input signal 20c (input C) by opening the switch 24c, this charge stored in the capacitor 26 ($C_{Charge}$) may inject an offset noise into the signal of the channel C during time the switch 24c is open, which may cause an error in the A/D converted output for the channel C. In other words, in the example shown in FIG. 2 with open circuit in channel B, the input 20c (input C) may then be read to be larger than expected due to this charge transfer from the open input B when the switch 24b was open.

Some recent programs have utilized common software for Input/Output (IO) processing even though all the I/O of the programs are not the same. This results in inputs to the multiplexer intentionally remaining open. For instance, when an input is opened in use, the subsequent input converted by the A/D after that opened input has an error term added from the charge injection. The solution was to force the A/D to read a ground input between every conversion which consumed A/D conversion time even though data from the grounded input was not used. In many cases this is not feasible due to throughput and timing requirements. Additionally, the dual use application program resulted in compiling unique IO software because the IO logic could not automatically manage the unused input interface (channel) in the time multiplexer.

It is to be appreciated that these approaches are costly and/or cause performance degradation. It is thus desirable to overcome the aforementioned drawbacks by effectively managing open input/channel in the time multiplexer, which is disclosed in the various exemplary embodiments described herein.

A method, apparatus/system and software related product (e.g., a computer readable memory) are presented for providing an open multiplexer channel charge injection elimination circuit. One embodiment comprises monitoring an output of an electronic processing component such as A/D converter, and detecting an out-of-range value in the output of that electronic processing component such as A/D converter during one time period during which one channel of input channels (e.g., analog input channels) of a time multiplexer provides an input signal to the electronic processing component (A/D converter). This may follow by performing corrective actions based on the detected out-of-range value. The corrective actions are further described below but comprise at least excluding further multiplexing of signals from the one channel (having the open circuit) identified using this determined out-of scale value.

It is appreciated and understood that the out-of-range value may be caused by an open circuit in the one channel (such as channel B in FIG. 2) of the input channels of the time multiplexer, such that the open circuit in the one channel causes charging of a charge capacitor of the time multiplexer with a parasitic charge when the one channel is open, so that the parasitic charge may negatively affect reading in time domain of a channel (such as channel with input C in FIG. 2) next to the one channel (channel with input B) of the input channels.

Corrective actions may further include providing a correct value in a next time multiplexing cycle for a channel next to the one channel of the input channels as further discussed in reference to FIGS. 3 and 4 below. In further embodiments, after detecting one of the input channels to be defective (having an open circuit) based on determining the an out-of-range value, and before processing by the electronic processing component (A/D converter) an input of a channel next to the one channel, the corrective actions may include the below discussed actions.

Figure 3:
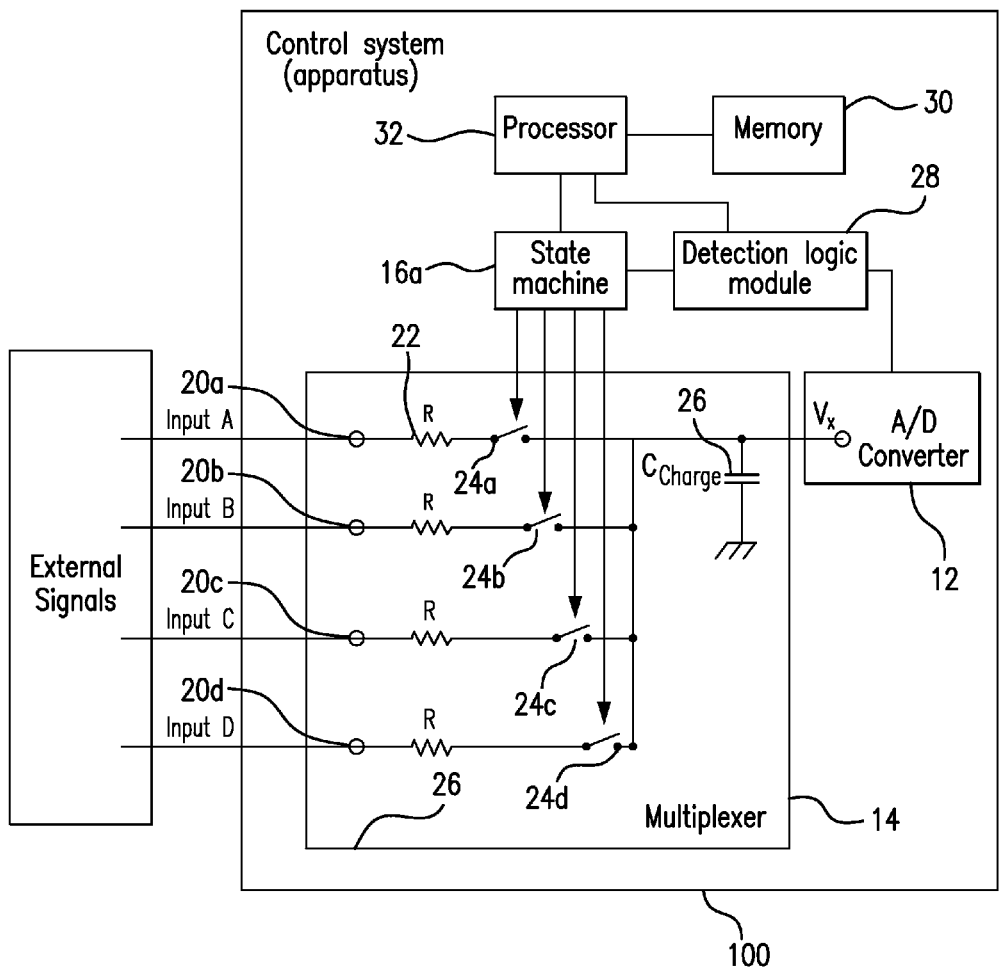
FIG. 3 depicts an exemplary embodiment of a control system (apparatus) for implementing corrective actions in case of an open circuit in one of the input channels of the time multiplexer.

FIG. 3 shows an exemplary embodiment of a control system (device or apparatus) 100 for implementing corrective actions in case of an open circuit in one of the input channels of the time multiplexer 14. The system 100 comprises a multiplexer 14a, an A/D converter 12, a detection logic module 28, a state machine 16a, a processor 32 and at least one memory 30. The multiplexer 14a, and A/D converter 12 may be parts of the system/apparatus 100 or may be separate blocks/modules. FIG. 3 is a simplified block diagram of various components that are suitable for practicing the exemplary embodiments, and a specific manner in which components are configured to cause that control system to operate.

According to an exemplary embodiment, a detection logic module (digital processing block) 28 is added to monitor the converted A/D values to detect an out-of scale value and therefore to determine if any of the input channels (with corresponding input signals 20a, 20b, 20c and 20d) are open.

The module 28 may be implemented as an application computer program stored in the memory 30, but in general it may be implemented as software, firmware and/or hardware module or a combination thereof. In particular, in the case of software or firmware, one embodiment may be implemented using a software related product such as a computer readable memory (e.g., non-transitory computer readable memory), computer readable medium or a computer readable storage structure comprising computer readable instructions (e.g., program instructions) using a computer program code (i.e., the software or firmware) thereon to be executed by a computer processor. Furthermore, the module 28 may be implemented as a separate block or may be combined with any other module/block of the system/apparatus 100, or it may be split into several blocks according to their functionality.

After detecting an open input in one of the input channels by the detection logic module 28, the state machine 16a may be modified, using an input/command from the detection logic module 28 to take corrective actions by providing appropriate commands to the multiplexer 14a. The correcting actions may include at least excluding further multiplexing of signals from the one channel (having the open circuit) identified using this determined out-of scale value, and eliminating errors in the channel next (in time domain) to this defective channel having the open circuit as described above and further discussed in reference to FIGS. 4 and 5.

Thus, it is appreciated and understood that the open circuit input channel would then have no effect on subsequent A/D conversion due to the charge injection in the capacitor 26, which is eliminated using the embodiments described herein. Also, as software (for example stored in the memory 30) would be able to read the status of which channel/interface is considered open, it may also force the state machine to restart and verify (for example, using the module 28) that the out of range inputs are still out of range if needed.

It is to be appreciated that the state machine 16a may be implemented as a hardware module such as a field programmable gate array (FPGA). Alternatively, the state machine 16a may be implemented as an application computer program, for example stored in the memory 30, but in general it may be implemented as software, firmware and/or hardware module or a combination thereof. In particular, in the case of software or firmware, one embodiment may be implemented using a software related product such as a computer readable memory (e.g., non-transitory computer readable memory), computer readable medium or a computer readable storage structure comprising computer readable instructions (e.g., program instructions) using a computer program code (i.e., the software or firmware) thereon to be executed by a computer processor. Furthermore, the state machine 16a may be implemented as a separate block or may be combined with any other module/block of the system/apparatus 100, or it may be split into several blocks according to their functionality.

Various embodiments of the at least one memory 30 (e.g., computer readable memory) may include any data storage technology type which is suitable to the local technical environment, including but not limited to semiconductor based memory devices, magnetic memory devices and systems, optical memory devices and systems, fixed memory, removable memory, disc memory, flash memory, DRAM, SRAM, EEPROM and the like. Various embodiments of the processor 32 may include but are not limited to, general purpose computers, special purpose computers, microprocessors, digital signal processors (DSPs) and multi-core processors.

FIG. 4 depicts an embodiment of state machine states illustrating corrective actions for an open circuit in one of the input channels of the time multiplexer. In FIG. 4 it is determined (for example by the module 28 of FIG. 3) that the channel B has an open value (out-of range value in the output of the A/D converter 12) during a time slot 37a.

The corrective action in FIG. 4 comprises a realization that the value read on channel C during a time slot 37b may have an error due to the charging the capacitor 26 during the time slot 37a and therefore the value of channel C during the time slot 37b may be discarded. Then in a next time multiplexing cycle during a time slot 37c (which corresponds to the defective/open channel B), instead of closing the switch 24b of the channel B, the state machine closes the switch 24c for the channel C, which is repeated during the time slot 37d. The value of Vc provided to the A/D converter for the channel C during the time slot 37d this is a correct value. The value Vc during the time slot 37c (which may be a correct value as well) is not used (which may be discarded). It is noted Vc is the voltage at the input to the A/D, which should also be the output from the A/D.

Figure 5:
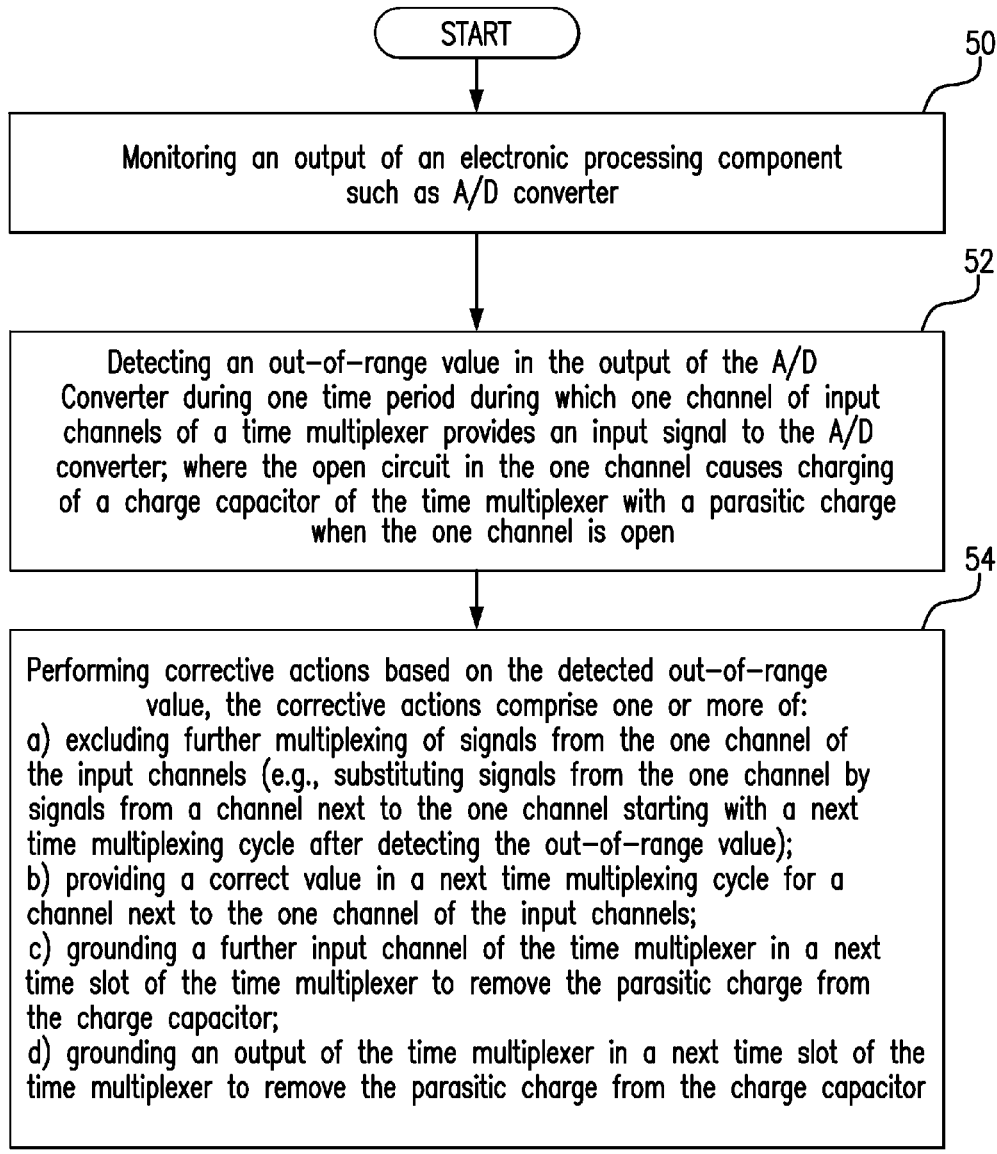
FIG. 5 depicts a flow chart illustrating implementation of various embodiments.

With reference now to FIG. 5, shown is a flow chart demonstrating implementation of the various illustrated embodiments. It is noted that the order of steps shown in FIG. 5 is not required, so in principle, the various steps may be performed out of the illustrated order. Also certain steps may be skipped, different steps may be added or substituted, or selected steps or groups of steps may be performed in a separate application following the embodiments described herein.

In a method according to the embodiment shown in FIG. 5, in a first step 50, a detection logic module of a control system (apparatus) such as one shown in FIG. 3 monitors an output of an electronic processing component such as A/D converter.

In a next step 52, the detection logic module detects an out-of-range value in the output of the A/D converter during one time period during which one channel of input channels of a time multiplexer provides an input signal to the A/D converter; where the open circuit in the one channel causes charging of a charge capacitor of the time multiplexer with a parasitic charge when the one channel is closed.

In a next step 54, a state machine of a control system (apparatus) performs corrective actions based on the detected out-of-range value, whereby the corrective actions comprise one or more of:

a) excluding further multiplexing of signals from the one channel of the input channels (e.g., substituting signals from the one channel by signals from a channel next to the one channel starting with a next time multiplexing cycle after detecting the out-of-range value);

b) providing a correct value in a next time multiplexing cycle for a channel next to the one channel of the input channels;

c) grounding a further input channel of the time multiplexer in a next time slot of the time multiplexer to remove the parasitic charge from the charge capacitor; and d) grounding an output of the time multiplexer in a next time slot of the time multiplexer to remove the parasitic charge from the charge capacitor.

It is noted that various non-limiting embodiments described herein may be used separately, combined or selectively combined for specific applications.

Further, some of the various features of the above non-limiting embodiments may be used to advantage without the corresponding use of other described features. The foregoing description should therefore be considered as merely illustrative of the principles, teachings and exemplary embodiments of this invention, and not in limitation thereof.

It is to be understood that the above-described arrangements are only illustrative of the application of the principles of the present invention. Numerous modifications and alternative arrangements may be devised by those skilled in the art without departing from the scope of the invention, and the appended claims are intended to cover such modifications and arrangements.

What is claimed is:

1. A method, comprising:
monitoring an output of an electronic processing component;
detecting an out-of-range value in the output of the electronic processing component during one time period during which one channel of input channels of a time multiplexer provides an input signal to the electronic processing component; and
performing corrective actions based on the detected out-of-range value, the corrective actions comprise at least excluding further multiplexing of signals from the one channel of the input channels and providing a correct value in a next time multiplexing cycle for a channel next to the one channel of the input channels.

2. The method of claim 1, wherein the electronic processing component is an analog-to-digital convertor and the input channels are analog input channels.

3. The method of claim 1, wherein the out-of-range value is caused by an open circuit in the one channel of the input channels of the time multiplexer.

4. The method of claim 3, wherein the open circuit in the one channel causes charging of a charge capacitor of the time multiplexer with a parasitic charge when the one channel is open, so that the parasitic charge negatively affects reading in time domain of a next converted channel in time to the one channel of the input channels.

5. The method of claim 1, wherein excluding further multiplexing of signals from the one channel of the input channels comprise substituting signals from the one channel by signals from a channel next to the one channel starting with a next time multiplexing cycle after detecting the out-of-range value.

6. An apparatus, comprising:
at least one processor and a memory storing a set of computer instructions, in which the processor and the memory storing the computer instructions are configured to cause the apparatus to:

monitor an output of an electronic processing component;

detect an out-of-range value in the output of the electronic processing component during one time period during which one channel of input channels of a time multiplexer provides an input signal to the electronic processing component; and perform corrective actions based on the detected out-of-range value, the corrective actions comprise at least excluding further multiplexing of signals from the one channel of the input channels wherein the out-of-range value is caused by an open circuit in the one channel of the input channels of the time multiplexer.

7. The apparatus of claim 6, wherein the electronic processing component is an analog-to-digital convertor and the input channels are analog input channels.

8. The apparatus of claim 6, wherein the open circuit in the one channel causes charging of a charge capacitor of the time multiplexer with a parasitic charge when the one channel is open, so that the parasitic charge negatively affects reading in time domain of a channel next to the one channel of the input channels.

9. An apparatus, comprising:
a detection logic module configured to monitor an output of an electronic processing component and to detect an out-of-range value in the output of the electronic processing component during one time period during which one channel of input channels of a time multiplexer provides an input signal to the electronic processing component; and
a control module, configured to perform corrective actions based on the detected out-of-range value, the corrective actions comprise at least excluding further multiplexing of signals from the one channel of the input channels wherein the control module comprises a field programmable gate array.

10. The apparatus of claim 9, wherein the control module comprises a state machine.

11. The apparatus of claim 9, wherein the electronic processing component is an analog-to-digital convertor and the input channels are analog input channels.

12. The apparatus of claim 9, wherein the out-of-range value is caused by an open circuit in the one channel of the input channels of the time multiplexer.

13. The apparatus of claim 12, wherein the open circuit in the one channel causes charging of a charge capacitor of the time multiplexer with a parasitic charge when the one channel is open, so that the parasitic charge negatively affects reading in time domain of a channel next to the one channel of the input channels.

14. A computer program product comprising a non-transitory computer readable medium bearing computer program code embodied therein for use with a computer, the computer program code comprising:
code for monitoring an output of an electronic processing component;
code for detecting an out-of-range value in the output of the electronic processing component during one time period during which one channel of input channels of a time multiplexer provides an input signal to the electronic processing component; and
code for performing corrective actions based on the detected out-of-range value, the corrective actions comprise at least excluding further multiplexing of signals from the one channel of the input channels wherein the out-of-range value is caused by an open circuit in the one channel of the input channels of the time multiplexer.

15. The computer program product method of claim 14, wherein the electronic processing component is an analog-to-digital convertor and the input channels are analog input channels.

16. The computer program product method of claim 14, wherein the open circuit in the one channel causes charging of a charge capacitor of the time multiplexer with a parasitic charge when the one channel is open, so that the parasitic charge negatively affects reading in time domain of a channel next to the one channel of the input channels.

* * * * *